(12) United States Patent
Yoneyama et al.

(10) Patent No.: US 11,114,836 B2
(45) Date of Patent: Sep. 7, 2021

(54) SEMICONDUCTOR DEVICE, INTELLIGENT POWER MODULE AND POWER CONVERSION APPARATUS

(71) Applicant: Mitsubishi Electric Corporation, Tokyo (JP)

(72) Inventors: Rei Yoneyama, Tokyo (JP); Fumitaka Tametani, Tokyo (JP); Manabu Matsumoto, Tokyo (JP); Haruhiko Takemoto, Tokyo (JP); Hiroshi Yoshida, Tokyo (JP); Motonobu Joko, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 1233 days.

(21) Appl. No.: 15/094,469

(22) Filed: Apr. 8, 2016

(65) Prior Publication Data
US 2017/0063071 A1   Mar. 2, 2017

(30) Foreign Application Priority Data
Aug. 28, 2015   (JP) .............................. JP2015-169145

(51) Int. Cl.
*H02H 3/00*   (2006.01)
*H02H 3/08*   (2006.01)
(Continued)

(52) U.S. Cl.
CPC .............. *H02H 3/08* (2013.01); *H01L 23/049* (2013.01); *H01L 23/3114* (2013.01);
(Continued)

(58) Field of Classification Search
CPC ........ H02H 3/20; H02H 5/04; H01L 29/7393; H01L 29/861; H01L 29/1608;
(Continued)

(56) References Cited

U.S. PATENT DOCUMENTS 5,389,813 A * 2/1995 Schwob .............. H01L 27/0248
257/469
6,735,065 B2   5/2004 Graf et al.
(Continued)

FOREIGN PATENT DOCUMENTS

CN   103035605 A   4/2013
CN   104143973 A   11/2014
(Continued)

OTHER PUBLICATIONS

An Office Action; "Notification of Reasons for Refusal," issued by the Japanese Patent Office dated Jul. 17, 2018, which corresponds to Japanese Patent Application No. 2015-169145 and is related to U.S. Appl. No. 15/094,469; with English language translation.
(Continued)

*Primary Examiner* — Jared Fureman
*Assistant Examiner* — Lucy M Thomas
(74) *Attorney, Agent, or Firm* — Studebaker & Brackett PC

(57) ABSTRACT

The present invention relates to a semiconductor device and it is an object of the present invention to provide a semiconductor device that makes it easy to change a specification on driving of a power semiconductor element or control of a protection operation thereof. The semiconductor device includes a power semiconductor element, a main electrode terminal of the power semiconductor element, a sensor section that emits a signal corresponding to a physical state of the power semiconductor element, a sensor signal terminal connected to the sensor section, a drive terminal that supplies power to drive the power semiconductor element and a case that accommodates the power semiconductor element, the main electrode terminal, the sensor section, the sensor signal terminal and the drive terminal, and the sensor
(Continued)

signal terminal and the drive terminal are provided so as to be connectable from outside the case.

18 Claims, 16 Drawing Sheets

(51) Int. Cl.
| | |
|---|---|
| H02H 5/04 | (2006.01) |
| H02M 7/00 | (2006.01) |
| H02H 7/10 | (2006.01) |
| H02H 7/22 | (2006.01) |
| H01L 23/049 | (2006.01) |
| H01L 23/31 | (2006.01) |
| H01L 23/498 | (2006.01) |
| H01L 27/02 | (2006.01) |
| H01L 29/16 | (2006.01) |
| H01L 29/20 | (2006.01) |
| H01L 29/739 | (2006.01) |
| H01L 29/861 | (2006.01) |
| H02H 3/20 | (2006.01) |
| H02M 1/32 | (2007.01) |
| H02M 7/5387 | (2007.01) |
| H02M 1/08 | (2006.01) |

(52) U.S. Cl.
CPC .. *H01L 23/49811* (2013.01); *H01L 23/49844* (2013.01); *H01L 27/0248* (2013.01); *H01L 29/1602* (2013.01); *H01L 29/1608* (2013.01); *H01L 29/2003* (2013.01); *H01L 29/7393* (2013.01); *H01L 29/861* (2013.01); *H02H 3/085* (2013.01); *H02H 3/20* (2013.01); *H02H 5/04* (2013.01); *H02H 5/041* (2013.01); *H02H 7/10* (2013.01); *H02H 7/222* (2013.01); *H02M 7/003* (2013.01); *H01L 2224/48137* (2013.01); *H01L 2224/4903* (2013.01); *H01L 2224/73265* (2013.01); *H01L 2924/181* (2013.01); *H01L 2924/19107* (2013.01); *H02M 1/08* (2013.01); *H02M 1/32* (2013.01); *H02M 1/327* (2021.05); *H02M 7/5387* (2013.01)

(58) Field of Classification Search
CPC ............. H01L 29/2003; H01L 29/1602; H01L 23/49811; H01L 23/49844; H01L 23/049; H02M 1/08
USPC .......................................................... 361/86
See application file for complete search history.

(56) References Cited

U.S. PATENT DOCUMENTS

| | | | |
|---|---|---|---|
| 2001/0038143 A1 | 11/2001 | Sonobe et al. | |
| 2005/0088120 A1* | 4/2005 | Avis | H01M 2/1055 |
| | | | 315/360 |
| 2007/0159751 A1* | 7/2007 | Hussein | H01L 27/0255 |
| | | | 361/100 |
| 2010/0134979 A1 | 6/2010 | Obiraki et al. | |
| 2012/0187554 A1 | 7/2012 | Oka et al. | |
| 2012/0188712 A1 | 7/2012 | Ishibashi et al. | |
| 2013/0082283 A1 | 4/2013 | Otsuki et al. | |
| 2014/0167242 A1 | 6/2014 | Kim et al. | |
| 2014/0332877 A1* | 11/2014 | Noebauer | H01L 27/0251 |
| | | | 257/328 |
| 2014/0332881 A1 | 11/2014 | Noebauer et al. | |
| 2015/0116945 A1 | 4/2015 | Minamio | |
| 2015/0130071 A1* | 5/2015 | Hohlfeld | H01L 25/074 |
| | | | 257/774 |
| 2016/0343641 A1* | 11/2016 | Hori | H01L 23/473 |

FOREIGN PATENT DOCUMENTS

| | | |
|---|---|---|
| JP | Hei06-303778 A | 10/1994 |
| JP | 2009-106073 A | 5/2009 |
| JP | 2010-129867 A | 6/2010 |
| JP | 2011-077280 A | 4/2011 |
| JP | 2011-176974 A | 9/2011 |
| JP | 2012-151019 A | 8/2012 |
| JP | 2012-157161 A | 8/2012 |
| JP | 2013-074254 A | 4/2013 |
| WO | 2013/175714 A1 | 11/2013 |

OTHER PUBLICATIONS

An Office Action issued by the Chinese Patent Office dated Jul. 16, 2018, which corresponds to Chinese Patent Application No. 201610741974.4 and is related to U.S. Appl. No. 15/094,469; with English language translation.

An Office Action issued by the German Patent Office dated Oct. 30, 2018, which corresponds to German Patent Application No. 10 2016 215 889.9 and is related to U.S. Appl. No. 15/094,469; with partial English language translation.

An Office Action mailed by the German Patent and Trademark Office dated Mar. 21, 2019, which corresponds to German Patent Application No. 102016215889.9 and is related to U.S. Appl. No. 15/094,469.

An Office Action mailed by the Chinese Patent Office dated Oct. 11, 2019, which corresponds to Chinese Patent Application No. 201610741974.4 and is related to U.S. Appl. No. 15/094,469.

An Office Action mailed by The State Intellectual Property Office of People's Republic of China dated Apr. 30, 2019, which corresponds to Chinese Patent Application No. 201610741974.4 and is related to U.S. Appl. No. 15/094,469.

* cited by examiner

SEMICONDUCTOR DEVICE, INTELLIGENT POWER MODULE AND POWER CONVERSION APPARATUS

BACKGROUND OF THE INVENTION

Field

The present invention relates to a semiconductor device, an intelligent power module and a power conversion apparatus, and more specifically, to a power semiconductor device, and an intelligent power module and a power conversion apparatus using the same.

Background Art

An IPM (intelligent power module) is generally equipped with a power semiconductor element such as an IGBT (insulated gate bipolar transistor), MOSFET (metal-oxide-semiconductor field-effect transistor), and FWDi (free wheeling diode or reflux diode). The IPM also has a function of controlling driving of the power semiconductor element. Furthermore, the IPM is also provided with a sensor section that transmits information on a temperature, current value or the like of the power semiconductor element. The IPM is provided with a function of protecting the power semiconductor element from overheat, overcurrent or the like using signals transmitted from the sensor section. The IPM thus provided with the drive control function and the protective function for the power semiconductor device is packaged and used for an inverse conversion section or the like of an inverter apparatus (e.g., see Japanese Patent Application Laid-Open No. 6-303778).

In the conventional IPM, the power semiconductor element, sensor section, the drive control circuit and the protection operation control circuit for the power semiconductor element are integrally accommodated in the package. For this reason, when the specification on control over driving or protection operation is changed, the specification needs to be changed for each IPM, which is time-consuming.

SUMMARY

The present invention has been implemented to solve the above-described problems and it is a first object of the present invention to provide a semiconductor device that makes it easy to change a specification on control over driving or protection operation of a power semiconductor element.

It is a second object of the present invention to provide an IPM using the semiconductor device according to the present invention.

It is a third object of the present invention to provide a power conversion apparatus using the semiconductor device or IPM according to the present invention.

The features and advantages of the present invention may be summarized as follows.

According to the present invention, a semiconductor device includes a power semiconductor element, a main electrode terminal of the power semiconductor element, a sensor section that emits a signal corresponding to a physical state of the power semiconductor element, a sensor signal terminal connected to the sensor section, a drive terminal that supplies power to drive the power semiconductor element; and, a case that accommodates the power semiconductor element, the main electrode terminal, the sensor section, the sensor signal terminal and the drive terminal, wherein the sensor signal terminal and the drive terminal are provided so as to be connectable from outside the case.

Other and further objects, features and advantages of the invention will appear more fully from the following description.

DESCRIPTION OF EMBODIMENTS

Figure 1:
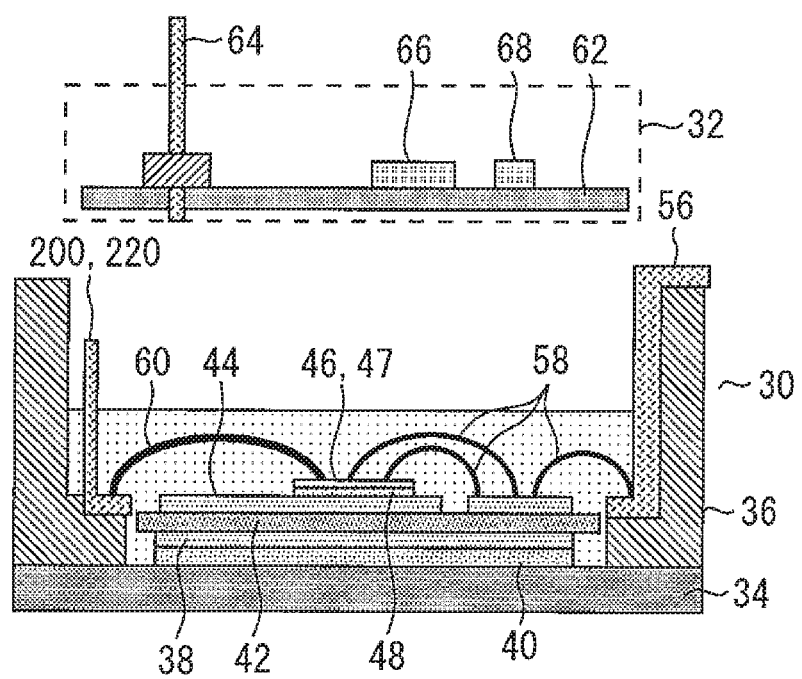
FIG. 1 is a cross-sectional view of a semiconductor device and a control substrate according to a first embodiment of the present invention.

A semiconductor device according to an embodiment of the present invention will be described with reference to the accompanying drawings. Identical or corresponding components are assigned identical reference numerals and duplicate description may be omitted.

First Embodiment

FIG. 1 is a cross-sectional view of a semiconductor device 30 and a control substrate 32 according to a first embodiment of the present invention. In the semiconductor device 30, a case 36 is disposed on a base plate 34. Inside the case 36, a wiring pattern 38 is connected to the base plate 34 by solder 40. An insulating substrate 42 is disposed on a top surface of the wiring pattern 38. A wiring pattern 44 is disposed on a top surface of the insulating substrate 42. A power semiconductor element 46 and a sensor section 47 are connected to a top surface of the wiring pattern 44 by solder 48. The sensor section 47 emits a signal corresponding to a temperature of the power semiconductor element 46 and a signal corresponding to a current that flows through the power semiconductor element 46.

Inside the case 36, a sensor signal terminal 200, a drive terminal 220 and a main electrode terminal 56 are disposed outside the insulating substrate 42. A certain space is provided between the sensor signal terminal 200, the drive terminal 220, the main electrode terminal 56 and the insulating substrate 42. Here, although the sensor signal terminal 200, the drive terminal 220 and the main electrode terminal 56 are each provided in plurality, since these terminals overlap with each other in FIG. 1, they are described as one terminal. The sensor signal terminal 200 is connected to the sensor section 47. The drive terminal 220 supplies power to drive the power semiconductor element 46. The power semiconductor element 46 and the main electrode terminal 56 are connected via power wiring bonding wires 58. The power semiconductor element 46, the sensor signal terminal 200 and the drive terminal 220 are connected via a signal wiring bonding wire 60.

The control substrate 32 is provided with a printed circuit board 62. The printed circuit board 62 is provided with an external input/output control signal terminal 64, an integrated circuit 66 and a control circuit part 68 on a top surface thereof.

Figure 2:
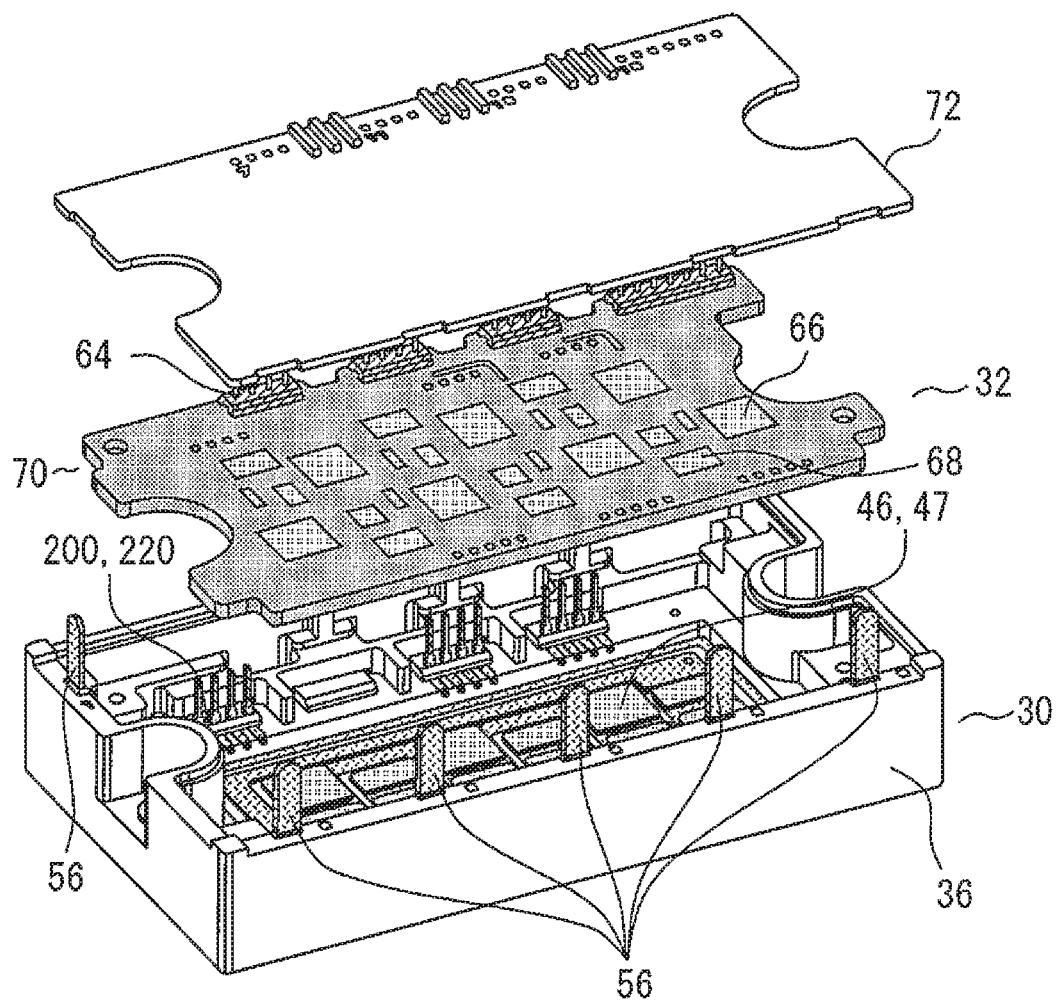
FIG. 2 is a perspective view illustrating an example of an IPM made up of the semiconductor device and the control substrate according to a first embodiment of the present invention.

FIG. 2 is a perspective view illustrating an example of an IPM 70 made up of the semiconductor device 30 and the control substrate 32 according to the present embodiment. The control substrate 32 is disposed on the semiconductor device 30. The semiconductor device 30 and the control substrate 32 are connected via the sensor signal terminal 200 and the drive terminal 220. The IPM 70 is constructed by further placing a cover 72 on the control substrate 32.

Figure 3:
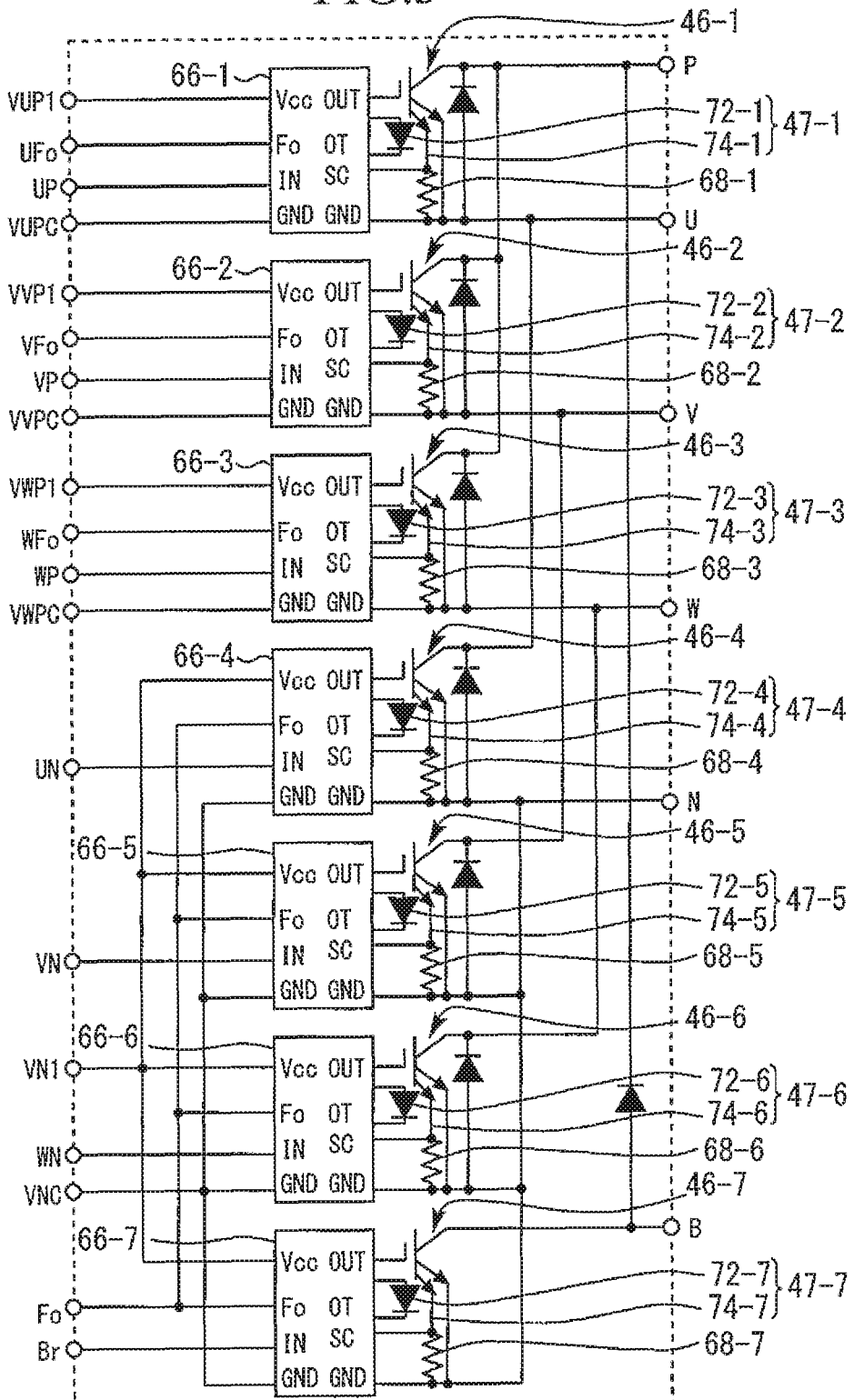
FIG. 3 is a circuit diagram of the IPM constructed of the semiconductor device and the control substrate according to the first embodiment of the present invention.

FIG. 3 is a circuit diagram of the IPM 70 according to the present embodiment. In FIG. 1, although only one power semiconductor element 46 is described for convenience, a plurality of power semiconductor elements 46 may be provided in the present invention. FIG. 3 shows a circuit diagram in a case where there are seven power semiconductor elements 46.

Here, the seven power semiconductor elements 46 are assumed to be power semiconductor elements $46_{-1}$ to $46_{-7}$. In FIG. 1, the sensor section 47 is provided for the power semiconductor element 46, whereas in FIG. 3, the sensor sections $47_{-1}$ to $47_{-7}$ are provided for the power semiconductor elements $46_{-1}$ to $46_{-7}$ respectively. The integrated circuit 66 is provided in FIG. 1, whereas in FIG. 3, seven integrated circuits $66_{-1}$ to $66_{-7}$ are provided. In FIG. 3, resistors $68_{-1}$ to $68_{-7}$ correspond to the aforementioned control circuit part 68. Note that a capacitor may also be mounted as the control circuit part 68.

In FIG. 3, the power semiconductor elements $46_{-1}$ to $46_{-7}$ are IGBTs. The power semiconductor elements $46_{-1}$ to $46_{-6}$ are connected, constituting a three-phase inverter circuit. P, U, V, W, N and B arranged at a right end of the circuit diagram shown in FIG. 3 correspond to the aforementioned main electrode terminals 56. P denotes an inverter power supply, N denotes an inverter ground, U, V and W denote inverter outputs.

The power semiconductor element $46_{-7}$ is provided to prevent a potential between P and N from rising due to a regenerative current when the inverter decelerates. B is a collector electrode of the power semiconductor element $46_{-7}$. The power semiconductor elements $46_{-1}$ to $46_{-7}$ are each provided with an FWDi.

Sensor sections $47_{-1}$ to $47_{-7}$ are constructed of temperature sensor sections $72_{-1}$ to $72_{-7}$ and current sensor sections $74_{-1}$ to $74_{-7}$. The temperature sensor sections $72_{-1}$ to $72_{-7}$ emit signals corresponding to temperatures of the power semiconductor elements $46_{-1}$ to $46_{-7}$. The current sensor sections $74_{-1}$ to $74_{-7}$ emit signals corresponding to currents flowing through the power semiconductor elements $46_{-1}$ to $46_{-7}$.

The integrated circuits $66_{-1}$ to $66_{-7}$ are each provided with Vcc, Fo, IN, GND, OUT, OT and SC as terminals. Vcc is a power supply terminal. Fo is an error output terminal. IN is an input terminal of drive signals of the power semiconductor elements $46_{-1}$ to $46_{-7}$. GND is a reference power supply terminal. OUT is a terminal for controlling driving of the power semiconductor element and connected to gates of the power semiconductor elements $46_{-1}$ to $46_{-7}$. OT is a control terminal with a protective function against overheat and is connected to the temperature sensor sections $72_{-1}$ to $72_{-7}$. SC is a control terminal with a protective function against overcurrent and connected to the current sensor sections $74_{-1}$ to $74_{-7}$. Furthermore, SC is connected to GND via resistors $68_{-1}$ to $68_{-7}$.

VUP1, VVP1, VWP1, VN1, UFo, VFo, WFo, Fo, UP, VP, WP, UN, VN, WN, Br, VUPC, VVPC, VWPC and VNC arranged at a left end of the circuit diagram shown in FIG. 3 correspond to the aforementioned external input/output control signal terminal 64. VUP1, VVP1, VWP1 and VN1 are power supply terminals and connected to Vcc's of the integrated circuits $66_{-1}$ to $66_{-7}$ respectively. UFo, VFo, WFo and Fo are error output terminals and connected to Fo's of the integrated circuits $66_{-1}$ to $66_{-7}$. UP, VP, WP, UN, VN, WN and Br are input terminals of drive signals of the power semiconductor elements $46_{-1}$ to $46_{-7}$, and connected to IN's of the integrated circuits $66_{-1}$ to $66_{-7}$ respectively. VUPC, VVPC, VWPC and VNC are reference power supply terminals and connected to GNDs of the integrated circuits $66_{-1}$ to $66_{-7}$ respectively.

Figure 4:
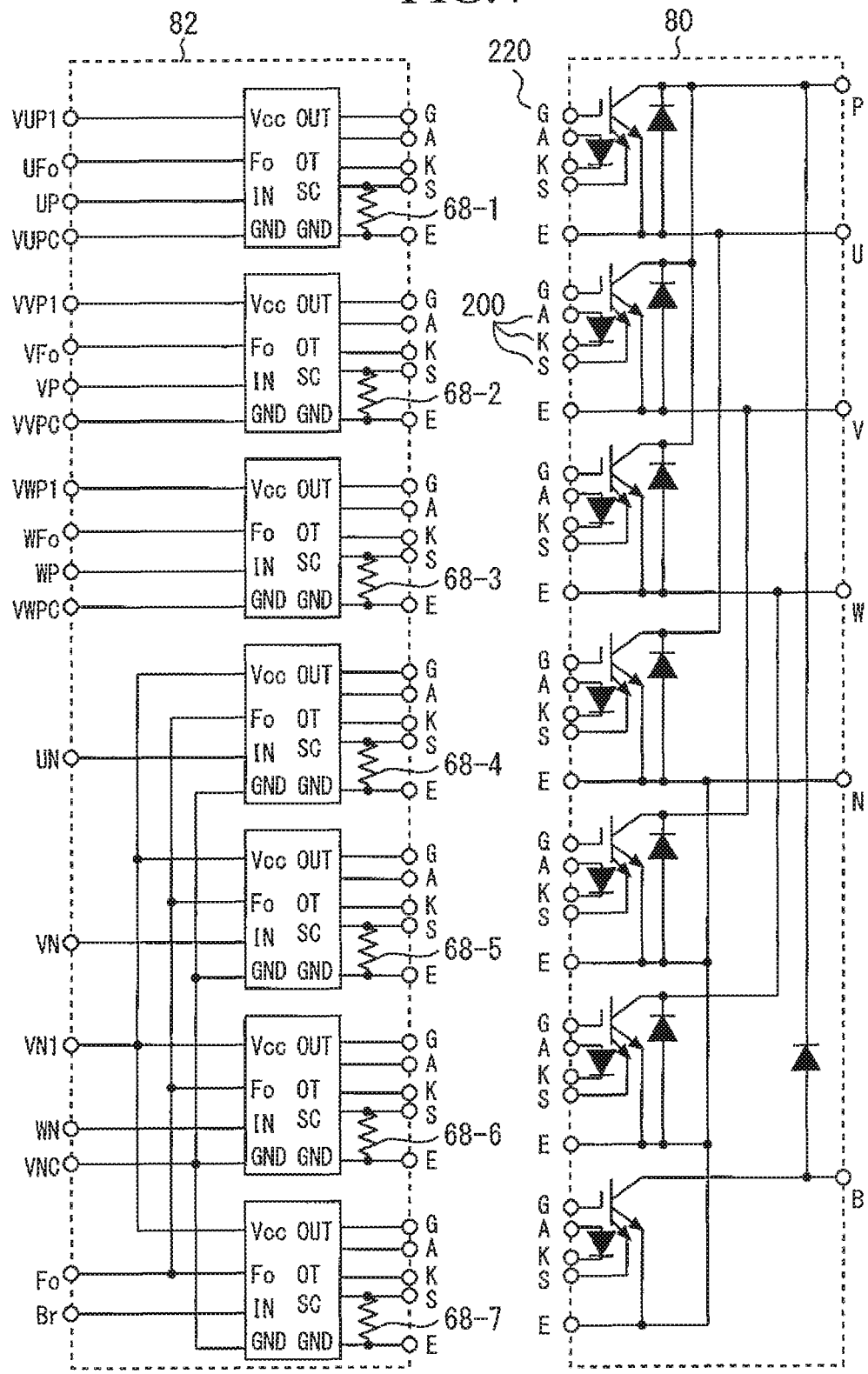
FIG. 4 illustrates a state in which the circuit diagram of the semiconductor device according to the first embodiment of the present invention is separated from the circuit diagram of the control substrate.

FIG. 4 illustrates a state of the IPM 70 according to the present embodiment in which the circuit diagram of the semiconductor device 30 is separated from the circuit diagram of the control substrate 32. A circuit diagram 80 is the circuit diagram of the semiconductor device 30 and a circuit diagram 82 is the circuit diagram of the control substrate 32. In the circuit diagram 80, a terminal G corresponds to the drive terminal 220. On the other hand, terminals A, K and S correspond to the sensor signal terminal 200. A terminal E is a reference power supply terminal. A circuit of the IPM 70 is constructed by connecting the terminals G, A, K, S and E to their respective terminals G, A, K, S and E of the circuit diagram 82.

Note that although the resistors $68_{-1}$ to $68_{-7}$ are mounted on the control substrate 32 side in FIG. 3 and FIG. 4, the resistors $68_{-1}$ to $68_{-7}$ may be mounted on the semiconductor device 30 side.

Figure 5:
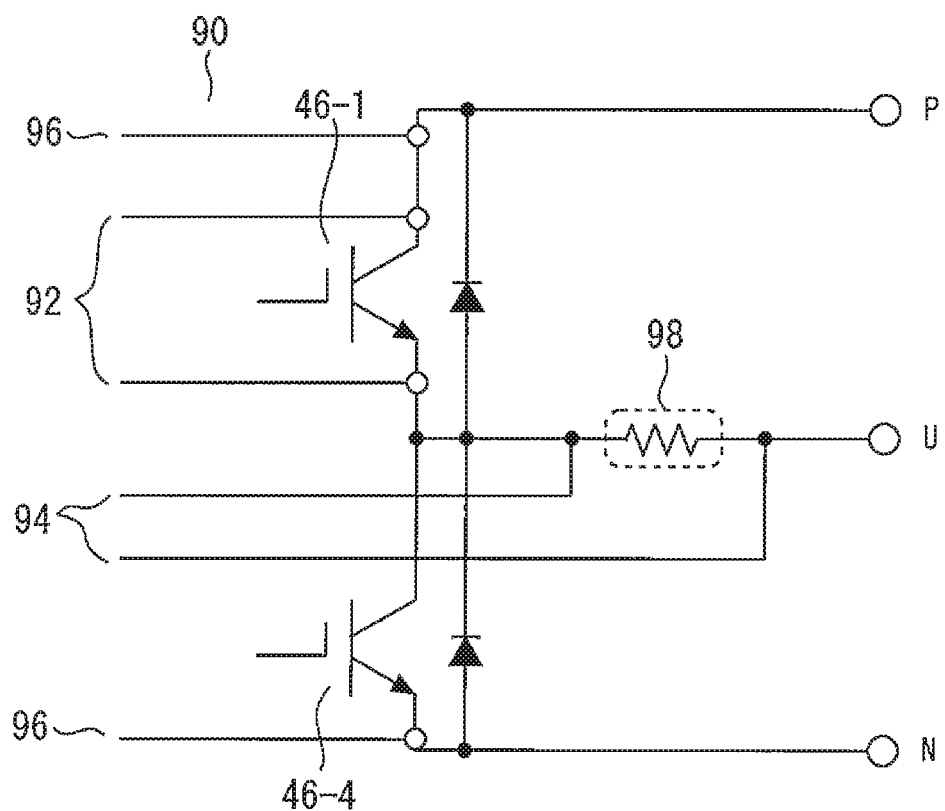
FIG. 5 is a circuit diagram of the sensor section according to a first embodiment of the present invention.

FIG. 5 is another example of the circuit diagram of the sensor section 47 according to the present embodiment. For convenience, of the three-phase inverter circuits shown in FIG. 3 and FIG. 4, portions of the power semiconductor elements $46_{-1}$ and $46_{-4}$ are extracted in FIG. 5. In FIG. 3 and FIG. 4, although the temperature sensor sections $72_{-1}$ to $72_{-7}$ and the current sensor sections $74_{-1}$ to $74_{-7}$ are mounted as the sensor sections $47_{-1}$ to $47_{-7}$, a voltage sensor section 90 that emits a signal corresponding to a voltage applied to each section of the semiconductor device 30 may also be further provided.

The voltage sensor section 90 is provided with a first voltage sensor section 92, a second voltage sensor section 94 and a third voltage sensor section 96. The first voltage sensor section 92 emits a signal corresponding to a collector-emitter voltage between the power semiconductor elements $46_{-1}$ and $46_{-4}$. The second voltage sensor section 94 emits a signal corresponding to a voltage applied to both ends of a shunt resistor 98 mounted on the wiring. The third voltage sensor section 96 emits a signal corresponding to a voltage between P and N. Note that the shunt resistor 98 need not be mounted. In this case, the second voltage sensor section 94 emits a signal corresponding to a voltage applied between two points on the wiring.

Figure 6:
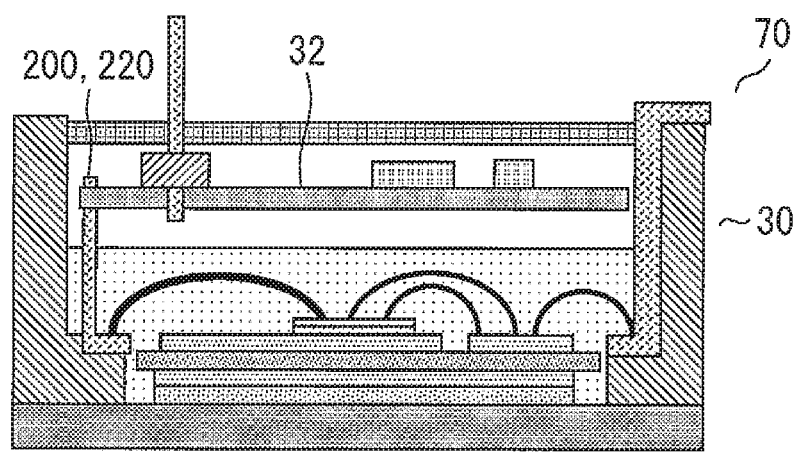
FIG. 6 is a cross-sectional view of the IPM constructed of the semiconductor device and the control substrate according to the first embodiment of the present invention.

FIG. 6 is a cross-sectional view of the IPM 70 constructed of the semiconductor device 30 and the control substrate 32 in the present embodiment. The semiconductor device 30 and the control substrate 32 are connected via the sensor signal terminal 200 and the drive terminal 220. Examples of the method of connecting the sensor signal terminal 200, the drive terminal 220 and the control substrate 32 include soldering, connection using a connector, ultrasound connection and welding.

With the conventional IPM, the power semiconductor element, the sensor section and the drive control circuit and the protection operation control circuit of the power semiconductor element are integrally accommodated in a package. With the IPM, specifications of the drive control circuit and the protection operation control circuit are frequently changed. However, in the conventional configuration, when the specifications of these control circuits are changed, the specifications need to be changed for each IPM and a long development period is required.

In the present embodiment, the semiconductor device 30 and the control substrate 32 are configured separately and the control substrate 32 can be designed independently. For this reason, when the specifications of the drive and protection operation are changed, only the control substrate 32 may be changed. Therefore, the specifications can be changed more easily compared to a case where the specifications are changed for each IPM. Moreover, since the control substrate 32 that frequently changes the specifications is made independent, the semiconductor device 30 can be standardized. Therefore, it is possible to shorten the development period.

Furthermore, since the semiconductor device 30 and the control substrate 32 in the present embodiment are configured independently, the semiconductor device 30 alone can be used when seen from the user side. In the semiconductor device 30 according to the present embodiment, the sensor signal terminal 200 and the drive terminal 220 are provided so as to be connectable from outside the case 36. For this reason, the user can freely design the control circuit using the sensor signal terminal 200 and the drive terminal 220.

Furthermore, in the case of the conventional IPM, the user needs to design an apparatus on the user side in conformity with fixed IPM terminals. In the present embodiment, however, the user can freely design the control substrate 32. For this reason, the user can freely arrange the external input/output control signal terminal 64 or the like of the IPM. Therefore, the degree of freedom of the layout of the apparatus on the user side improves.

When the user uses the semiconductor module on which only the power semiconductor element is mounted, the user can freely design the sensor section, the drive control circuit and the protection operation control circuit. Here, the sensor section is preferably arranged near the power semiconductor element to achieve high-speed response. However, when the user provides the sensor section, it may be difficult to arrange the sensor section closer to the power semiconductor element due to layout constraints. For this reason, reliable protection operation may not be achieved.

The semiconductor device 30 is provided with the sensor section 47. For this reason, compared to a case using the semiconductor module on which only the power semiconductor element is mounted, a case using the semiconductor device 30 allows reliable control over the protection operation and driving.

Figure 7:
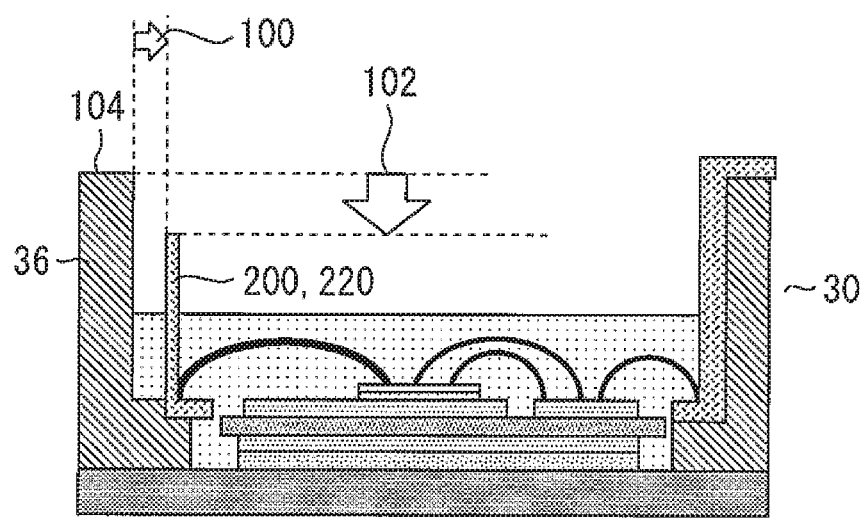
FIG. 7 is a cross-sectional view of the semiconductor device according to the first embodiment of the present invention.

FIG. 7 is a cross-sectional view of the semiconductor device 30 according to the present embodiment. Hereinafter, a terminal structure of the present embodiment will be described with reference to FIG. 7. In the present embodiment, as shown by an arrow 100, the sensor signal terminal 200 and the drive terminal 220 are arranged inside the case 36. Furthermore, as shown by an arrow 102, top ends of the sensor signal terminal 200 and the drive terminal 220 are located at positions lower than a top surface portion 104 of the case 36.

Figure 8A:
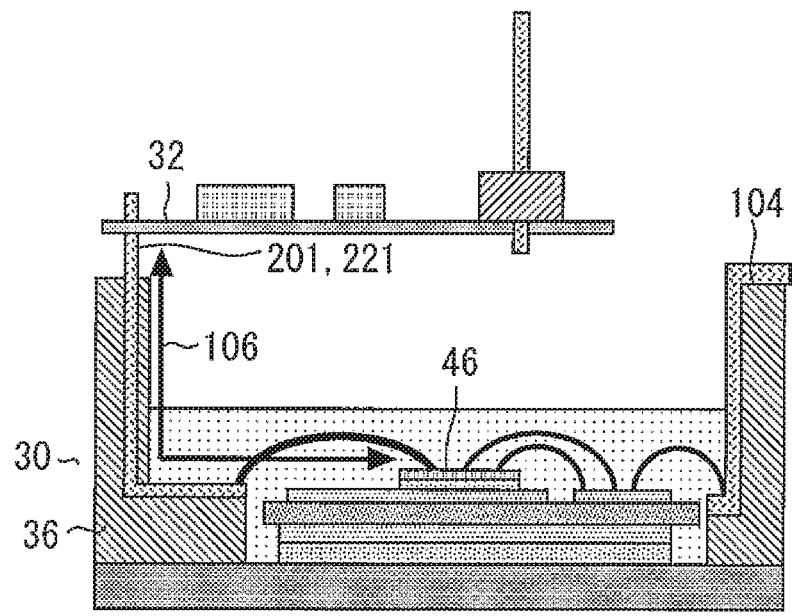
FIG. 8A is a cross-sectional view showing a wiring distance between the control substrate and the power semiconductor element in a state in which a comparative example of the semiconductor device and the control substrate are connected.

FIG. 8A shows a cross-sectional view of a state in which a comparative example of the semiconductor device 30 according to the present embodiment and the control substrate 32 are connected. The semiconductor device 30 shown in FIG. 8A is provided with a sensor signal terminal 201 and a drive terminal 221 embedded in one side face of the case 36. Top ends of the sensor signal terminal 201 and the drive terminal 221 are located higher than the top surface portion 104 of the case 36. An arrow 106 shows a wiring distance between the control substrate 32 and the power semiconductor element 46.

Figure 8B:
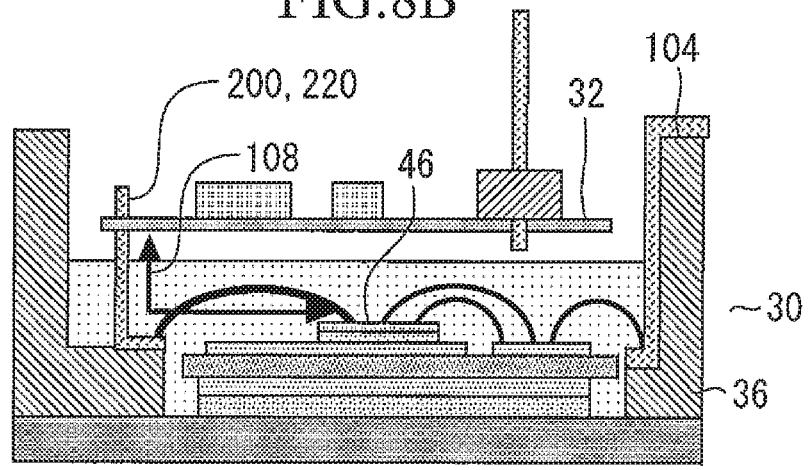
FIG. 8B is a cross-sectional view showing a wiring distance between the control substrate and the power semiconductor element in a state in which the semiconductor device according to the first embodiment of the present invention and the control substrate are connected.

On the contrary, FIG. 8B is a cross-sectional view of a state in which the semiconductor device 30 according to the present embodiment and the control substrate 32 are connected. An arrow 108 shows a wiring distance between the control substrate 32 and the power semiconductor element 46. When the arrow 108 is compared with the arrow 106 in FIG. 8A, the wiring distance between the control substrate 32 and the power semiconductor element 46 is shorter in the present embodiment.

Shortening the wiring distance from the control substrate 32 to the power semiconductor element 46 has an effect of reducing impedance, reducing extraneous noise and increasing the response speed. Therefore, it is possible to ensure control over driving and the protection operation of the power semiconductor element 46.

Figure 9A:
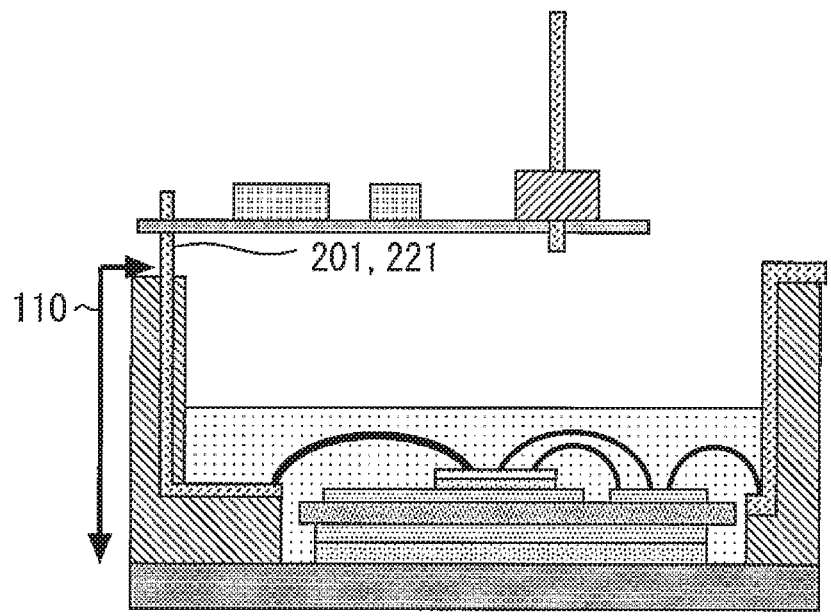
FIG. 9A is a cross-sectional view showing an insulating distance of the drive terminal and the sensor signal terminal in the state in which the comparative example of the semiconductor device and the control substrate are connected.
Figure 9B:
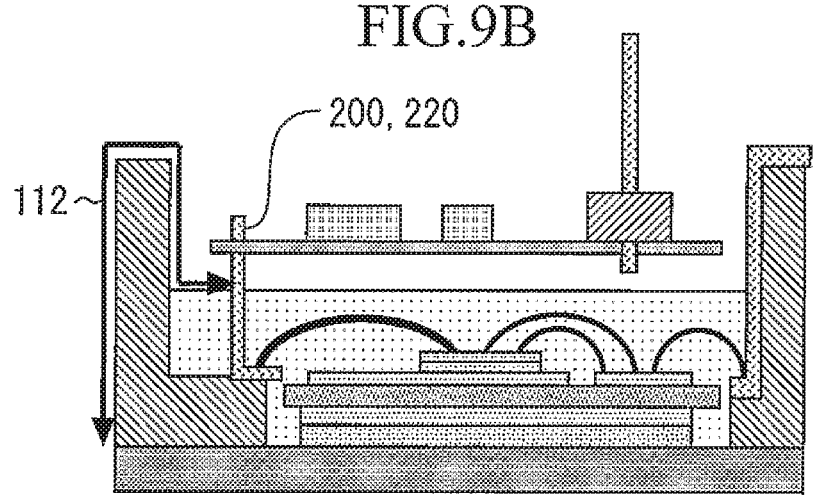
FIG. 9B is a cross-sectional view showing an insulating distance of the drive terminal and the sensor signal terminal in the state in which the semiconductor device according to the first embodiment of the present invention and the control substrate are connected.

FIG. 9A is a diagram showing an insulating distance between the sensor signal terminal 201, the drive terminal 221 and the outside of the case 36 using an arrow 110 in the aforementioned comparative example. FIG. 9B is a diagram showing an insulating distance between the sensor signal terminal 200, the drive terminal 220 and the outside of case 36 using an arrow 112 in the aforementioned present embodiment.

When the arrow 112 is compared with the arrow 110 in FIG. 9A, the insulating distance between the sensor signal terminal 200, the drive terminal 220 and the outside of case 36 in the present embodiment is longer. Therefore, it is possible to secure withstand voltage performance.

Second Embodiment

Figure 10:
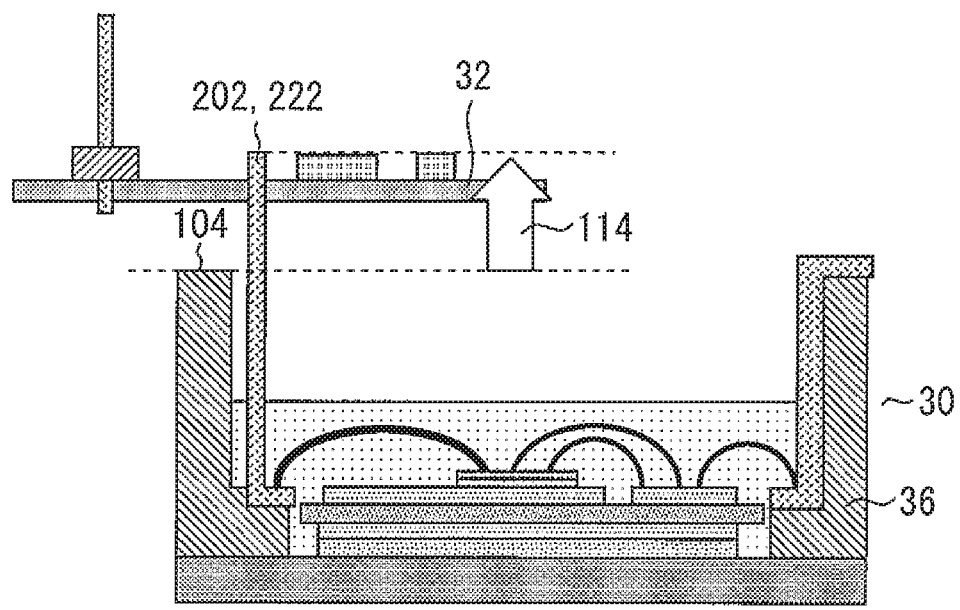
FIG. 10 is a cross-sectional view of a state in which the semiconductor device according to a second embodiment of the present invention and the control substrate are connected.

FIG. 10 is a cross-sectional view of a state in which the semiconductor device 30 and the control substrate 32 according to the present embodiment are connected. In the present embodiment, the semiconductor device 30 is provided with a sensor signal terminal 202 and a drive terminal 222. As shown by an arrow 114, top ends of the sensor signal terminal 202 and the drive terminal 222 are located higher than the top surface portion 104 of the case 36.

In the present embodiment, top ends of the sensor signal terminal 202 and the drive terminal 222 protrude out of the case 36. For this reason, the control substrate 32 can be placed at a position deviated from right above the semiconductor device 30. Furthermore, the size of the control substrate 32 can be made greater than the case. Therefore, the degree of freedom of the layout and size of the control substrate 32 improves.

Third Embodiment

Figure 11:
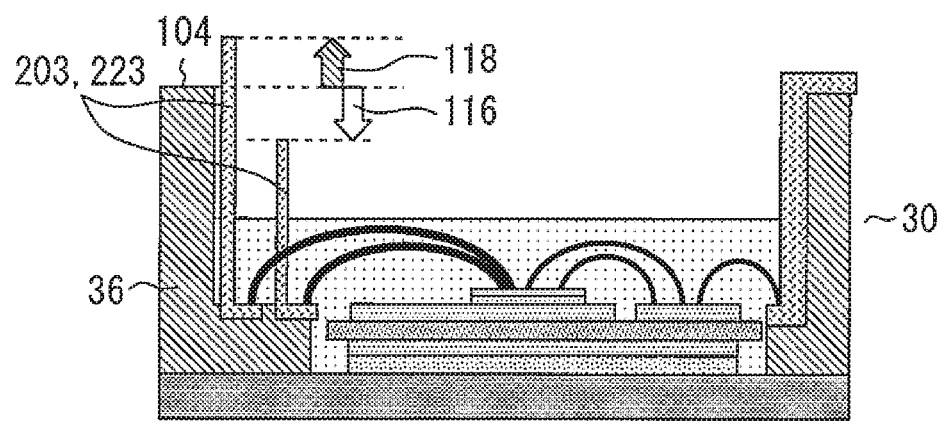
FIG. 11 is a cross-sectional view of the semiconductor device according to a third embodiment of the present invention.

FIG. 11 is a cross-sectional view of the semiconductor device 30 according to the present embodiment. The semiconductor device 30 according to the present embodiment is provided with a plurality of sensor signal terminals 203 and drive terminals 223 as in the case of the first embodiment. Top ends of some of the sensor signal terminals 203 and drive terminals 223 are lower than the top surface portion 104 of the case 36 and top ends of some of those terminals are higher than the top surface portion 104 of the case 36. Here, in FIG. 11, since the sensor signal terminals 203 and the drive terminals 223 overlap with each other, only two of the terminals are described.

Figure 12:
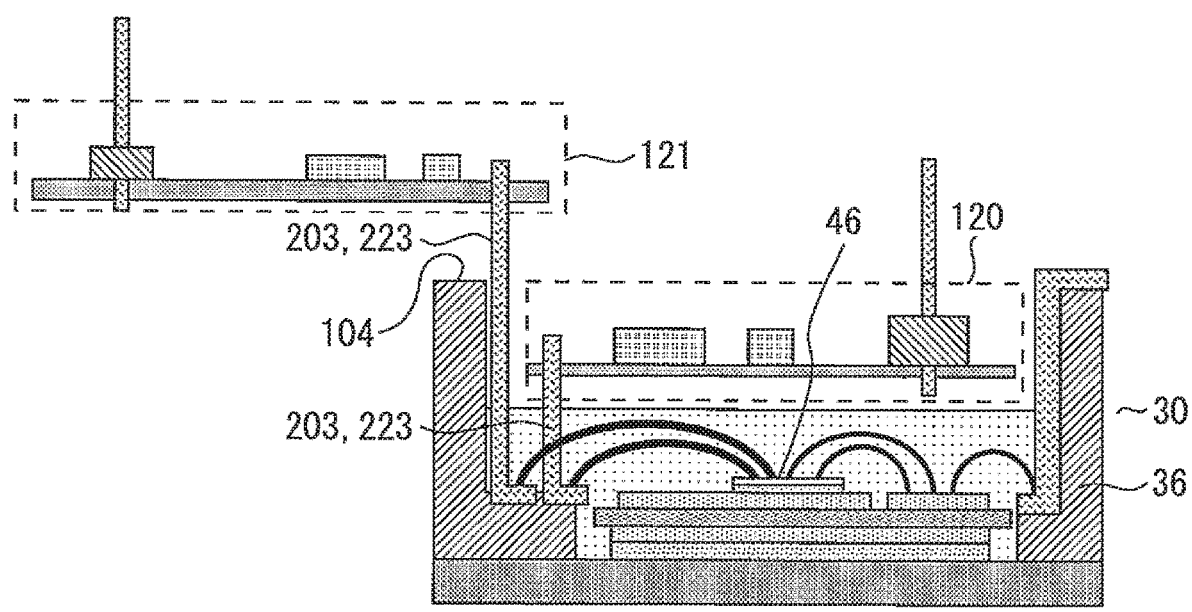
FIG. 12 is a cross-sectional view of a state in which the semiconductor device according to the third embodiment of the present invention and the control substrate are connected.

FIG. 12 is a cross-sectional view of a state in which two control substrates 120 and 121 are connected to the semiconductor device 30 according to the present embodiment. In order to reduce impedance, a circuit for which a wiring distance to the power semiconductor element 46 needs to be shortened is mounted on the first control substrate 120. Moreover, a circuit for which it is desirable to provide a degree of freedom of the layout for external connection is mounted on the second control substrate 121.

Of the sensor signal terminals 203 and the drive terminals 223, one connected to the first control substrate 120 is provided so that a top end thereof is lower than the top surface portion 104. Of the sensor signal terminals 203 and the drive terminals 223, one connected to the second control substrate 121 is provided so that a top end thereof is higher than the top surface portion 104. Therefore, the first control substrate 120 is disposed inside the case 36. The second control substrate 121 is disposed above the case 36. Therefore, a plurality of control substrates 120 and 121 can be connected to the semiconductor device 30 in the present embodiment. For this reason, it is possible to achieve both a reduction of impedance and an improvement of the degree of freedom of the layout. Furthermore, an improvement of the degree of freedom of the layout allows the size of the apparatus on the user side to be reduced.

Fourth Embodiment

Figure 13:
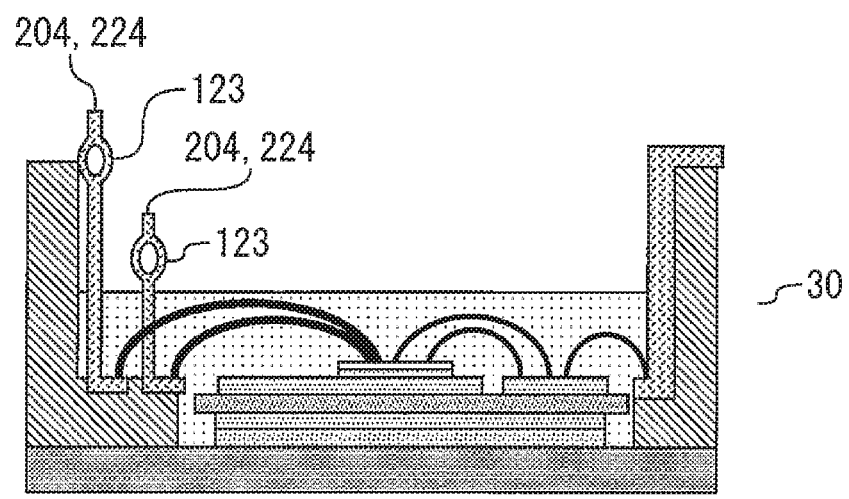
FIGS. 13 and 14 are cross-sectional views of the semiconductor device according to a forth embodiment of the present invention.

FIG. 13 is a cross-sectional view of the semiconductor device 30 according to the present embodiment. In the present embodiment, the semiconductor device 30 is provided with a sensor signal terminal 204 and a drive terminal 224. A part or whole of the sensor signal terminal 204 and the drive terminal 224 is made up of a press-fit terminal 123.

Figure 14:
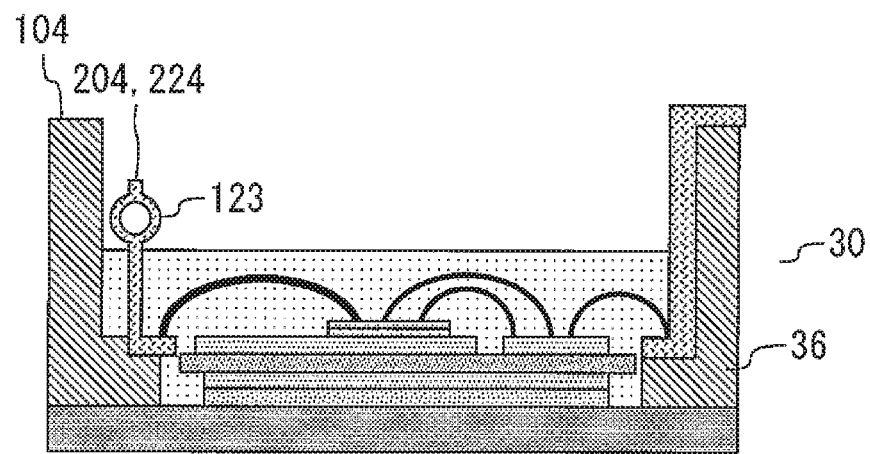

FIG. 14 is a cross-sectional view particularly when the sensor signal terminals 204 and the drive terminals 224 in the semiconductor device 30 according to the present embodiment whose top ends are disposed inside the case 36 and whose top ends are lower than the top surface portion 104 of the case 36 are extracted. Thus, when the sensor signal terminals 204 and the drive terminals 224 are accommodated inside the case 36, it is more difficult to connect the control substrate 32 compared to the case where these terminals protrude out of the top surface of the case 36. The present embodiment exhibits high effects when the sensor signal terminal 204 and the drive terminal 224 shown in FIG. 14 are accommodated inside the case 36. This will be described hereinafter using FIG. 15C according to the present embodiment and FIGS. 15A and 15B according to a comparative example.

Figure 15A:
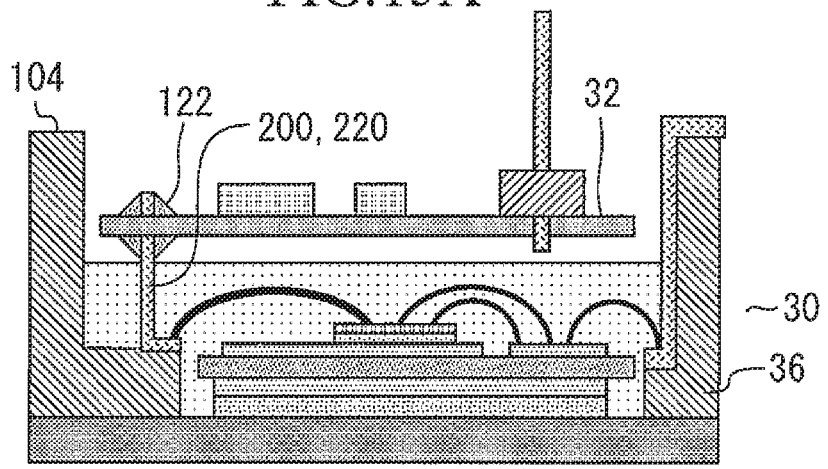
FIG. 15A shows a state in which the semiconductor device according to the present invention is connected to the control substrate by solder.
Figure 15B:
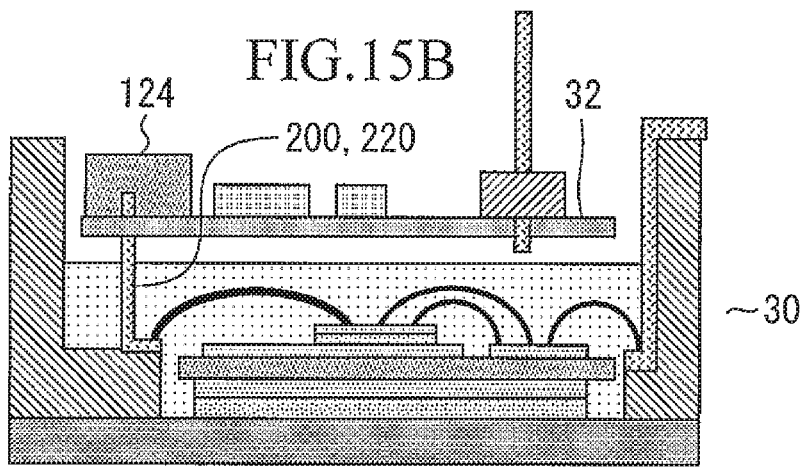
FIG. 15B shows a state in which the semiconductor device according to the present invention is connected to the control substrate via a connector.
Figure 15C:
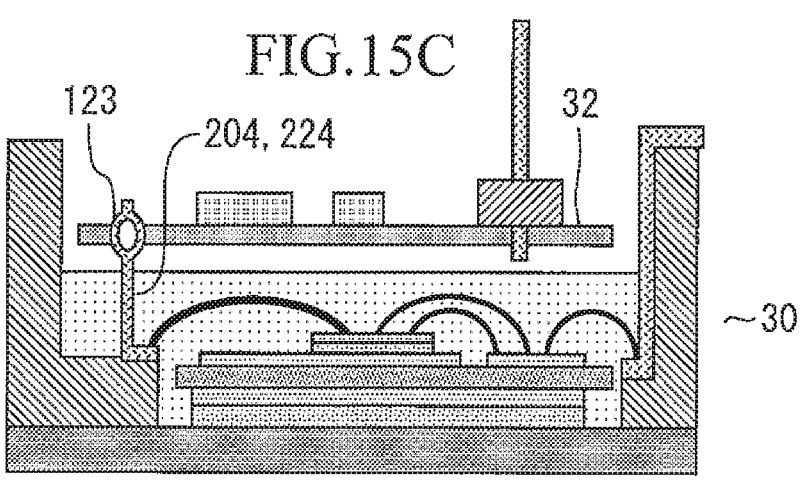
FIG. 15C is a cross-sectional view illustrating a state in which the semiconductor device according to the forth embodiment of the present invention is connected to the control substrate.

FIG. 15C is a cross-sectional view illustrating a state in which the semiconductor device 30 shown in FIG. 14 is connected to the control substrate 32. In the present embodiment, the sensor signal terminal 204 and the drive terminal 224 are made up of the press-fit terminal 123. The press-fit terminal 123 can be connected by press-fitting the press-fit terminal 123 into a through hole provided in the control substrate 32. For this reason, in the present embodiment, it is possible to easily connect the sensor signal terminal 204, the drive terminal 224 and the control substrate 32. Furthermore, the press-fit terminal 123 eliminates the need for a connection medium such as solder during connection. Therefore, it is possible to save the space of the control substrate 32.

FIG. 15A shows a comparative example of the present embodiment when the semiconductor device 30 is connected to the control substrate 32. In FIG. 15A, a sensor signal terminal 200 and a drive terminal 220, and the control substrate 32 are connected by solder 122. The sensor signal terminal 200 and the drive terminal 220 are disposed inside the case 36 and top ends thereof are lower than the top surface portion 104 of the case 36. In this case, connection by solder is difficult and low in productivity.

FIG. 15B shows another comparative example of the present embodiment when the semiconductor device 30 is connected to the control substrate 32. In FIG. 15B, the sensor signal terminal 200 and the drive terminal 220, and the control substrate 32 are connected via a connector 124. Use of the connector 124 facilitates connection. However, it is necessary to provide a space in which the connector 124 is mounted on the control substrate 32. Therefore, it is difficult to save space in the control substrate 32. Moreover, the presence of wiring inside the connector 124 causes the wiring distance to be longer.

Fifth Embodiment

Figure 16:
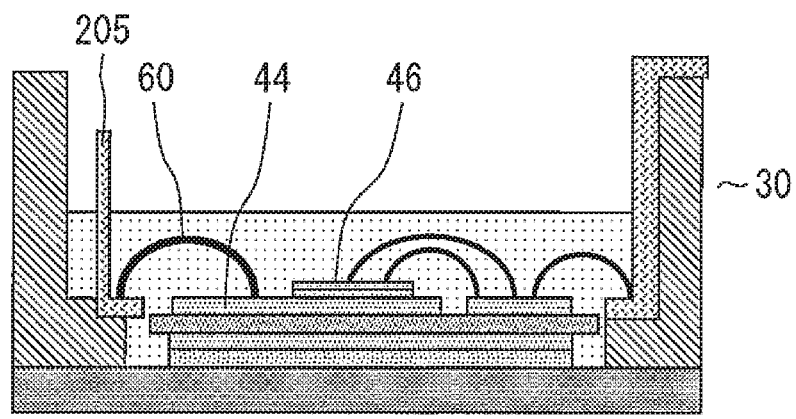
FIG. 16 is a cross-sectional view of the semiconductor device according to a fifth embodiment of the present invention.

FIG. 16 is a cross-sectional view of the semiconductor device 30 according to the present embodiment. In the present embodiment, the semiconductor device 30 is provided with a sensor signal terminal 205 that outputs a signal extracted from the wiring pattern 44. The sensor signal terminal 205 is connected to the wiring pattern 44 via the signal wiring bonding wire 60. The power semiconductor element 46 is mounted on the wiring pattern 44. According to the wiring pattern 44, a signal can be extracted from, for example, the underside of the power semiconductor element 46.

For this reason, with the sensor signal terminal 205 connected to the control substrate 32, the control substrate 32 can extract a signal from a location where it is difficult to make contact from the surface side of the power semiconductor element 46. Therefore, when the IPM 70 is constructed of the semiconductor device 30 and the control substrate 32 according to the present embodiment, it is possible to increase the protective function.

Particularly when the power semiconductor element 46 is an IGBT, the underside of the power semiconductor element 46 becomes a collector. For this reason, the wiring pattern 44 is connected to the collector. Therefore, the wiring pattern 44 becomes a sensor section that emits a signal corresponding to a potential of the collector. For this reason, the IPM 70 can be provided with a protective function corresponding to the collector potential.

Note that in the above example, a signal is extracted by the wiring pattern 44 from the underside of the power semiconductor element 46 and the signal is sent by the sensor signal terminal 205 to the control substrate 32, but this is not exclusive. The signal sent to the control substrate 32 via the wiring pattern can be any signal relating to a state of the power semiconductor element 46.

Sixth Embodiment

Figure 17:
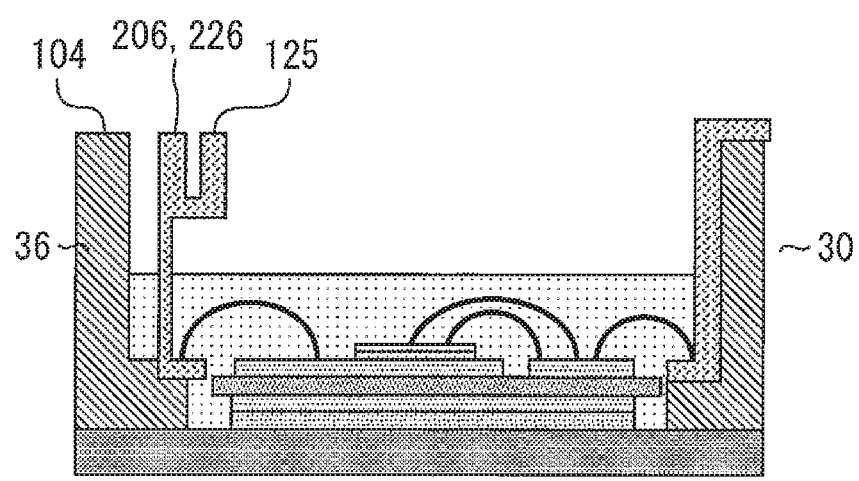
FIG. 17 is a cross-sectional view of the semiconductor device according to a sixth embodiment of the present invention.

FIG. 17 is a cross-sectional view of the semiconductor device 30 according to the present embodiment. In the present embodiment, the semiconductor device 30 is provided with a sensor signal terminal 206 and a drive terminal 226. The sensor signal terminal 206 and the drive terminal 226 are made up of a female type terminal 125. Moreover, a top end of the female type terminal 125 has the same height as the top surface portion 104 of the case 36.

Figure 18A:
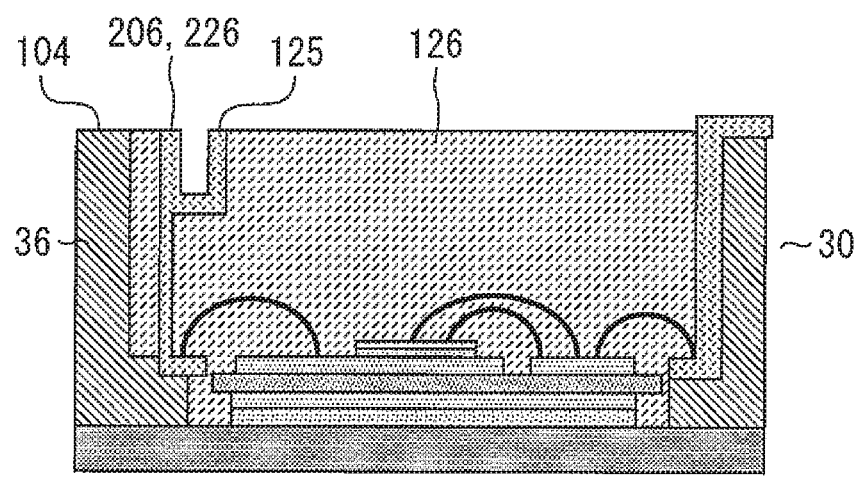
FIG. 18A is a cross-sectional view illustrating a state in which the semiconductor device according to the sixth embodiment of the present invention is filled with sealing resin up to the height of the top surface portion of the case.

FIG. 18A is a cross-sectional view illustrating a state in which the semiconductor device 30 according to the present embodiment is filled with sealing resin 126 up to the height of the top surface portion 104 of the case 36. The female type terminal 125 can be connected to the control substrate 32 by inserting a connection portion on the control substrate 32 side into the female type terminal 125. For this reason, the female type terminal 125 can be provided without protruding out of the top surface of the case 36. Therefore, it is possible to prevent breakage and/or bend of the sensor signal terminal 206 and the drive terminal 226 during assembly.

Figure 18B:
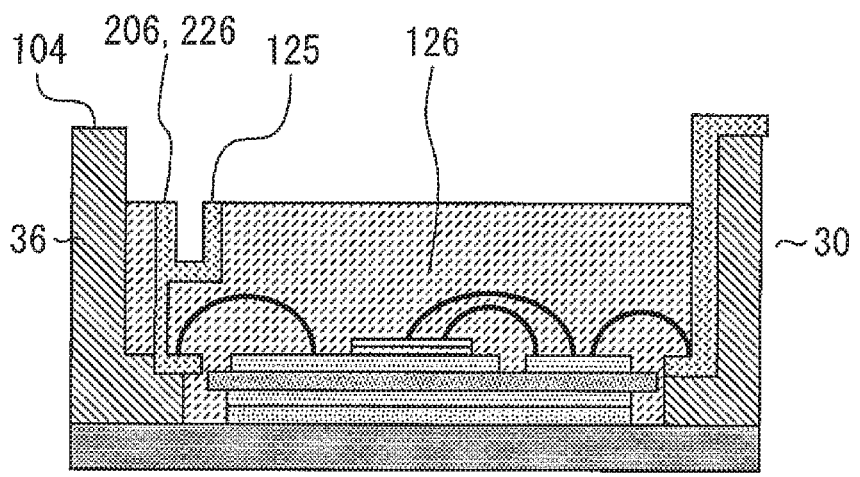
FIG. 18B is a cross-sectional view illustrating a state in which the semiconductor device according to a modification of the sixth embodiment of the present invention is filled with sealing resin up to the height of a top end of the female type terminal.

FIG. 18B is a modification of the present embodiment. Top ends of the sensor signal terminal 206 and the drive terminal 226 may be lower than the height of the top surface portion 104 of the case 36. By adopting the female type terminal 125 for the sensor signal terminal 206 and the drive terminal 226, it is possible to align top surfaces of the sealing resin 126 and the terminal. Therefore, it is possible to prevent breakage and/or bend of the sensor signal terminal 206 and the drive terminal 226 during assembly.

Seventh Embodiment

Figure 19:
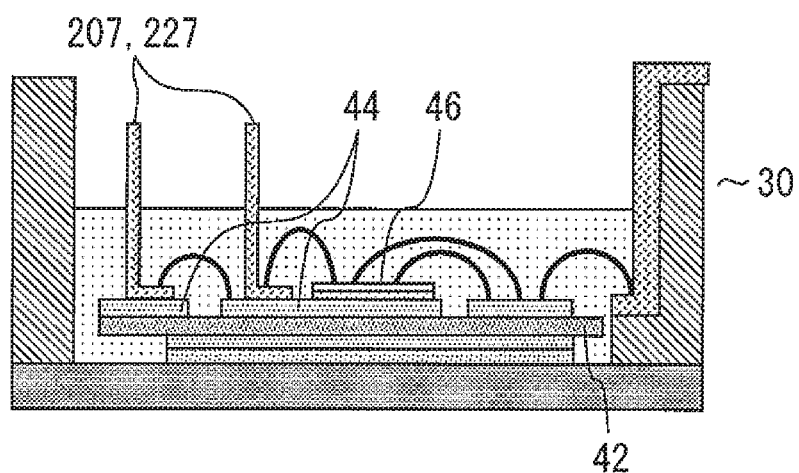
FIG. 19 is a cross-sectional view of the semiconductor device according to a seventh embodiment of the present invention.

FIG. 19 is a cross-sectional view of the semiconductor device 30 according to the present embodiment. In the present embodiment, a sensor signal terminal 207 and a drive terminal 227 are arranged on the wiring pattern 44. According to the configuration of the present embodiment, the sensor signal terminal 207 and the drive terminal 227 can be brought closer to the power semiconductor element 46 compared to the first embodiment. For this reason, it is possible to reduce impedance and achieve high-speed response. Moreover, this improves the degree of freedom of the position at which the sensor signal terminal 207 and the drive terminal 227 are extracted. In this way, the degree of freedom of the layout of the control substrate 32 improves. It is also possible to reduce the space for arranging terminals provided in the periphery of the insulating substrate 42 and thereby reduce the size of the semiconductor device 30.

Eighth Embodiment

Figure 20:
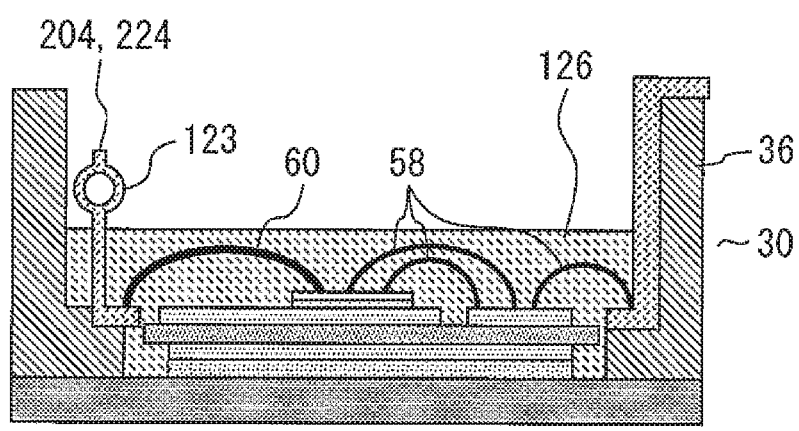
FIG. 20 is a cross-sectional view of the semiconductor device according to an eighth embodiment of the present invention.

FIG. 20 is a cross-sectional view of the semiconductor device 30 according to the present embodiment. In the present embodiment, the inside of the case 36 is filled with sealing resin 126. Examples of the method of filling include a direct potting structure that seals inner wiring with rigid resin and filling with transfer mold resin. In the present embodiment, the semiconductor device 30 is provided with the sensor signal terminal 204 and the drive terminal 224. The sensor signal terminal 204 and the drive terminal 224 are made up of the press-fit terminal 123.

By filling the inside of the case 36 with the sealing resin 126, the strength of the semiconductor device 30 improves. Moreover, reliability/life improves by firmly fixing the power semiconductor element 46, the power wiring bonding wire 58 and the signal wiring bonding wire 60. When the press-fit terminal 123 is connected to the control substrate 32, a force is applied to the terminal. In this case, roots of the sensor signal terminal 204 and the drive terminal 224 need to be firmly fixed. At this time, filling with the sealing resin 126 is particularly effective.

Although the sensor signal terminal 204 and the drive terminal 224 are made up of the press-fit terminal 123 in the present embodiment, terminals having other shapes may also be provided.

Ninth Embodiment

Figure 21:
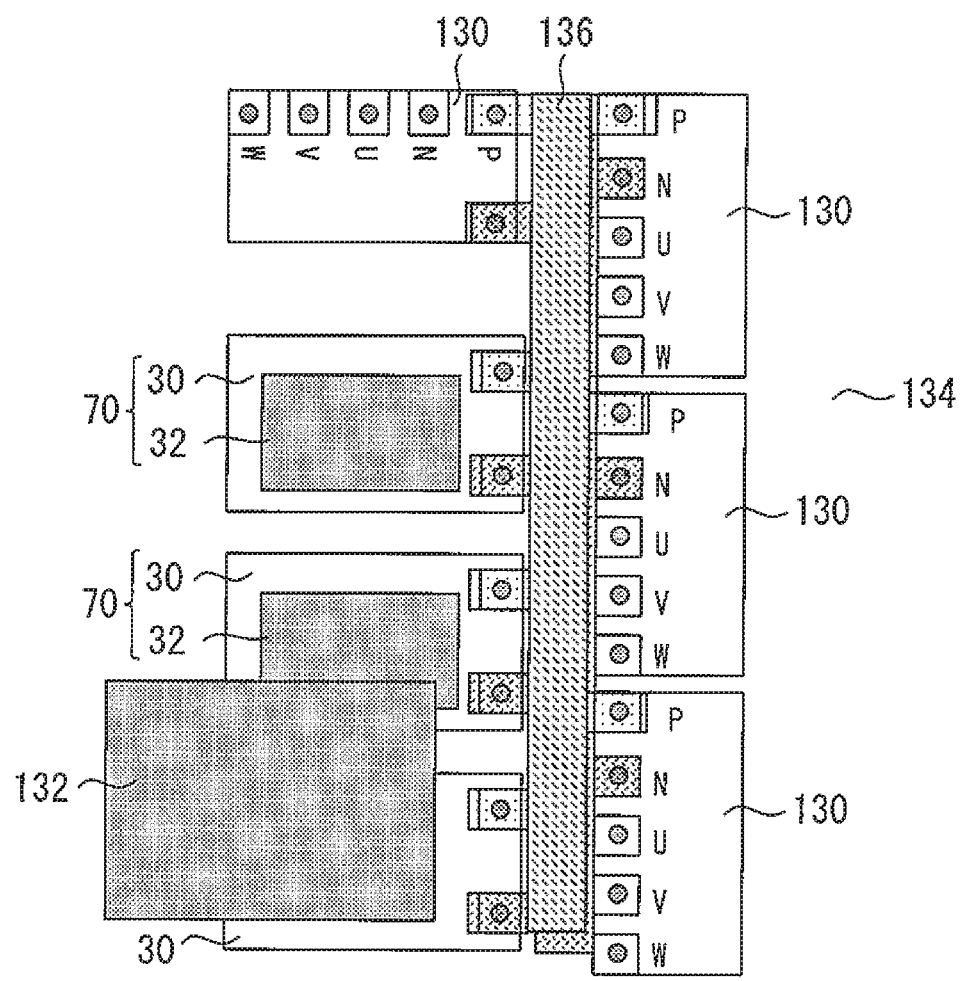
FIG. 21 is a plan view of a power conversion apparatus according to a ninth embodiment of the present invention.

FIG. 21 is a plan view of a power conversion apparatus 134 according to the present embodiment. The power conversion apparatus 134 is provided with the semiconductor device 30 according to the first to eighth embodiments, and two IPMs 70 using the semiconductor device 30 and four three-phase inverters 130. A user-provided control substrate 132 is connected to the semiconductor device 30. The semiconductor device 30, the IPMs 70 and the three-phase inverters 130 are connected to a bus bar 136. The power conversion apparatus 134 constitutes an inverter apparatus.

According to the conventional configuration, implementing a desired layout requires complicated routing of the bus bar 136. However, such routing of the bus bar 136 increases inductance. An increased inductance leads to an increase in voltage surge. On the other hand, adding a snubber circuit to suppress the voltage surge requires a space for disposing the snubber circuit, which prevents downsizing of the power conversion apparatus 134.

Using the semiconductor device 30 according to the first to eighth embodiments for the power conversion apparatus 134 improves the degree of freedom of the layout of the control substrates 32 and 132. Moreover, since the control substrates 32 and 132 can be designed independently of the semiconductor device 30, it is possible to freely arrange the external input/output control signal terminals 64 of the control substrates 32 and 132. For this reason, with the power conversion apparatus 134 equipped with the semiconductor device 30 and the IPM 70 using the semiconductor device 30, the degree of freedom of the layout of the apparatus improves. Therefore, it is possible to downsize the power conversion apparatus 134.

Conventionally, the number of power semiconductor elements 46 that can be mounted on the power conversion apparatus 134 is limited due to layout constraints. However, using the semiconductor device 30 or the IPM 70 using the semiconductor device 30 improves the degree of freedom of the layout. For this reason, it is possible to increase the number of power semiconductor elements 46 that can be mounted on the power conversion apparatus 134. Therefore, it is possible to improve functions of the power conversion apparatus 134.

Note that the power conversion apparatus 134 may be a converter apparatus, servo amplifier or power supply unit in addition to the inverter apparatus.

Tenth Embodiment

In the present embodiment, the power semiconductor element 46 provided for the semiconductor device 30, the IPM 70 and the power conversion apparatus 134 according to the first to ninth embodiments is formed of a wide bandgap semiconductor. The wide bandgap semiconductor is silicon carbide, nitride gallium-based material or diamond.

Since the wide bandgap semiconductor has little loss during high-speed switching and has high temperature resistance, the wide bandgap semiconductor is more frequently used for high-frequency, high-speed switching applications than it is used under conditions employed in silicon devices. For this reason, an increased surge voltage has been a problem.

As described above, using the semiconductor device 30 according to the first to eighth embodiments improves the degree of freedom of the layout. Therefore, it is possible to appropriately arrange the bus bar 136 and the snubber circuit. For this reason, it is possible to suppress a surge voltage in the semiconductor device 30, the IPM 70 and the power conversion apparatus 134 formed of the wide bandgap semiconductor.

A problem with the wide bandgap semiconductor is that there is large radiation noise from the wide bandgap semiconductor. With the semiconductor device 30 according to the third and fourth embodiments, it is possible to lay out the semiconductor device 30 by separating it from the control substrate 32. Therefore, it is possible to prevent the control substrate 32 from being affected by radiation noise from the wide bandgap semiconductor.

Note that the FWDi shown in FIG. 3, FIG. 4 and FIG. 5 may be formed of the wide bandgap semiconductor.

Obviously many modifications and variations of the present invention are possible in the light of the above teachings. It is therefore to be understood that within the scope of the appended claims the invention may be practiced otherwise than as specifically described.

The semiconductor device according to the present invention is provided with the power semiconductor element and the sensor section. The drive terminal of the power semiconductor and the sensor signal terminal connected to the sensor section are provided so as to be connectable from outside the case. The IPM is configured by connecting the control substrate to the semiconductor device according to the present invention. The control substrate controls driving and protection operation of the power semiconductor element. The semiconductor device and the control substrate are connected via the sensor signal terminal and the drive terminal. Since the semiconductor device and the control substrate are configured separately, it is possible to design the control substrate independently. For this reason, when the specification of driving and protection operation is changed, it is only necessary to change the control substrate. Therefore, the specification can be changed more easily compared to a case where the specification is changed for each IPM.

The invention claimed is:

1. A semiconductor device comprising:
   a power semiconductor element;
   a main electrode terminal of the power semiconductor element;
   a sensor section that emits a signal corresponding to a physical state of the power semiconductor element;
   a sensor signal terminal connected to the sensor section;
   a drive terminal that supplies power to drive the power semiconductor element; and
   a case that accommodates the power semiconductor element, the main electrode terminal, the sensor section, the sensor signal terminal and the drive terminal,
   wherein the sensor signal terminal and the drive terminal are provided so as to be connectable from outside the case.

2. The semiconductor device according to claim 1, wherein the physical state is a temperature.

3. The semiconductor device according to claim 1, wherein the physical state is a current.

4. The semiconductor device according to claim 1, wherein the physical state is a voltage.

5. The semiconductor device according to claim 1, wherein the sensor signal terminal and the drive terminal are disposed inside the case and top ends of the sensor signal terminal and the drive terminal are lower than a top surface portion of the case.

6. The semiconductor device according to claim 1, wherein top ends of the sensor signal terminal and the drive terminal are higher than a top surface portion of the case.

7. The semiconductor device according to claim 1, wherein the sensor signal terminal and the drive terminal comprise a terminal whose top end is lower than a top surface portion of the case and a terminal whose top end is higher than the top surface portion of the case.

8. The semiconductor device according to claim 1, wherein the sensor signal terminal comprises a terminal that outputs a signal extracted from a wiring pattern on which the power semiconductor element is mounted.

9. The semiconductor device according to claim 1, wherein the sensor signal terminal and the drive terminal are disposed on a wiring pattern.

10. The semiconductor device according to claim 1, wherein the power semiconductor element is formed of a wide bandgap semiconductor.

11. The semiconductor device according to claim 10, wherein the wide bandgap semiconductor is silicon carbide, nitride gallium-based material or diamond.

12. The semiconductor device according to claim 1, wherein the sensor signal terminal and the drive terminal comprise a press-fit terminal.

13. The semiconductor device according to claim 1, wherein the sensor signal terminal and the drive terminal are female type terminals.

14. The semiconductor device according to claim 1, wherein the inside of the case is filled with sealing resin.

15. An intelligent power module comprising:
the semiconductor device according to claim 1; and
a control substrate connected to the sensor signal terminal and the drive terminal,
wherein the control substrate comprises:
an external input/output control signal terminal; and
an integrated circuit, and
the integrated circuit is connected to the external input/output control signal terminal, the sensor signal terminal and the drive terminal, and controls driving of the power semiconductor element and controls a protection operation of the power semiconductor element corresponding to a signal outputted from the sensor signal terminal.

16. A power conversion apparatus comprising the semiconductor device according to claim 1.

17. The semiconductor device according to claim 1, wherein the sensor signal terminal is configured to transmit the signal corresponding to the physical state of the power semiconductor element, and the drive terminal is configured to receive the power to drive the power semiconductor element from outside the case.

18. The semiconductor device according to claim 1, wherein a top surface portion of the case is open.

* * * * *